United States Patent [19]

Leibfried

[11] Patent Number: 5,451,637
[45] Date of Patent: Sep. 19, 1995

[54] ORGANOSILICON COMPOSITIONS PREPARED FROM UNSATURATED ELASTOMERIC POLYMERS

[75] Inventor: Raymond T. Leibfried, New Castle County, Del.

[73] Assignee: Hercules Incorporated, Wilmington, Del.

[21] Appl. No.: 241,243

[22] Filed: May 10, 1994

[51] Int. Cl.⁶ .............................................. C08L 83/05
[52] U.S. Cl. .................................. 525/105; 525/106; 524/506; 428/447; 523/222
[58] Field of Search ............... 525/105, 106; 524/506; 523/222, 100

[56] References Cited

U.S. PATENT DOCUMENTS

| | | | |
|---|---|---|---|
| 3,159,662 | 12/1964 | Ashby | 528/18 |
| 3,197,432 | 7/1965 | Lamoreaux | 528/31 |
| 3,197,433 | 7/1965 | Lamoreaux | 528/31 |
| 3,220,972 | 11/1965 | Lamoreaux | 528/31 |
| 3,438,936 | 4/1969 | Lamoreaux | 528/31 |
| 3,715,246 | 2/1973 | Sayles | 149/19 |
| 3,715,334 | 2/1973 | Karstedt | 528/15 |
| 4,735,998 | 4/1988 | Itoh et al. | 525/31 |
| 4,780,510 | 10/1988 | Uemiya et al. | 525/326.5 |
| 4,831,081 | 5/1989 | King et al. | 525/108 |
| 4,877,820 | 10/1989 | Cowan | 523/222 |
| 4,900,779 | 2/1990 | Leibfried | 524/862 |
| 4,902,731 | 2/1990 | Leibfried | 523/222 |
| 5,008,360 | 4/1991 | Bard et al. | 528/25 |
| 5,010,137 | 4/1991 | Umeda et al. | 524/104 |
| 5,013,809 | 5/1991 | Leibfried | 524/862 |
| 5,025,048 | 6/1991 | Burnier | 524/99 |
| 5,068,303 | 11/1991 | Bard et al. | 528/25 |
| 5,077,134 | 12/1991 | Leibfried | 428/447 |
| 5,118,735 | 6/1992 | Burnier | 524/99 |
| 5,124,375 | 6/1992 | Leibfried | 523/222 |
| 5,124,423 | 6/1992 | Leibfried | 528/18 |
| 5,147,945 | 9/1992 | Leibfried et al. | 525/425 |
| 5,171,817 | 12/1992 | Barnum et al. | 528/15 |
| 5,196,498 | 3/1993 | Leibfried | 528/15 |
| 5,242,979 | 9/1993 | Barnum et al. | 525/106 |
| 5,298,536 | 3/1994 | Babcock et al. | 523/201 |

FOREIGN PATENT DOCUMENTS

| | | |
|---|---|---|
| 2536751 | 6/1984 | France. |
| 3342766 | 5/1984 | Germany. |
| 61-060727 | 3/1986 | Japan. |
| WO9010037 | 9/1990 | WIPO. |

OTHER PUBLICATIONS

Friedman et al., "Synthesis of Statistical Networks with Liquid Polybutadiene and Telechelic Bis (hydrogenosilyl) Coupling Agents", Ind. Eng. Chem. Prod. Res. Dev., 1986, 25(3), pp. 389–391.

Friedman et al., "Synthesis of Statistical Networks with Liquid Polybutadiene and Telechelic Bis (hydrogenosilyl) Coupling Agents", American Chemical Society Polymer Reprints, 26(1), 1985, pp. 268–269.

Friedman et al., "Synthesis of Statistical Networks from Liquid Polybutadiene-IV", European Polymer Journal, 20 (12), 1984, pp. 1151–1153.

Friedman et al., "Synthesis of Statistical Networks from Liquid Telechelic Dimethylhydrogenosilane Polydiene", Polymer Bulletin, 10 (1983), pp. 28–30.

"Kirk-Othmer Encyclopedia of Chemical Technology, Third Edition, vol. 8", John Wiley & Sons, New York, pp. 447–452.

Crivello et al., "Novel Platinum-containing Initiators for Ring-Opening Polymerizations", Journal of Polymer Science, Part A, 29 (1991), pp. 1853–1863.

(List continued on next page.)

Primary Examiner—Ralph H. Dean
Attorney, Agent, or Firm—Mark D. Kuller; Martin F. Sloan

[57] ABSTRACT

Crosslinkable and crosslinked compositions comprising silicon compounds, unsaturated elastomeric polymers and polyenes. Along with, or instead of these polyenes and silicon compounds, crosslinkable prepolymers prepared from such polyenes and silicon compounds may be included. Crosslinking, of the crosslinkable compositions, may be accomplished by hydrozilation, in the presence of hydrosylation catalysts.

55 Claims, No Drawings

OTHER PUBLICATIONS

Kaszas et al., "New Thermoplastic Elastomers of Rubbery Polyisobutylene and Glassy Cycloisoprene Segments", Journal of Applied Polymer Science, 39 (1990), pp. 119–144.

"Encyclopedia of Polymer Science and Engineering, vol. 14", John Wiley & Sons, pp. 764–765.

Spier, "Advances in Organometallic Chemistry, vol. 17", (1979), Academic Press, New York, pp. 407–415, pp. 428–434.

"Phosphorous Based Catalyst Retardants for Silicon–Carbon Resin Systems", Research Disclosures, 326103, (1991), pp. 467–468.

"Organosilicon Composition Containing Hydrocarbon Elastomer", Research Disclosures, 33082, (1991) pp. 799–800.

"Liquid Encapsulants, Flip Chip Encapsulants and Die Attach Adhesives", Research Disclosures, 33536, (1992), pp. 184–187.

"Platinum (II) Complexes as Catalysts for Silicon–Carbon Resin Systems", Research Disclosures, 33732, (1992), pp. 355–357.

"Transfer Molding Compounds for Encapsulation", Research Disclosures, 34139, (1992), pp. 707–709.

"Transfer Molding Compounds for Encapsulation", Research Disclosures, 35604, (1993), pp. 776–779.

"Organosilicon Polymers for Die Attach Adhesives", Research Disclosures, 35614, (1993), pp. 783–785.

"Metal Foils for Use with Organosilicon-Based Circuit Board Laminates", Research Disclosures, 35637, (1993), pp. 798–799.

"Coupling Agents to Improve Adhesion of Organosilicon Polymers", Research Disclosures, 35650, (1993), pp. 811–813.

ORGANOSILICON COMPOSITIONS PREPARED FROM UNSATURATED ELASTOMERIC POLYMERS

FIELD OF THE INVENTION

This invention relates to novel crosslinkable and crosslinked polymer compositions and to processes for preparing these compositions, It also encompasses silica-filled transfer molding compounds used for packaging electronic components comprising the crosslinked compositions.

BACKGROUND OF THE INVENTION

Brossas and Friedman have described hydrosilation crosslinking of elastomers in a number of publications. The authors described statistical networks made by hydrosilation crosslinking of polybutadiene using difunctional silane compounds in *Industrial and Engineering Chemistry Product Research & Development*, 25(3), p. 389-91; *ACS Polymer Preprints* 26(1), p. 268-9; *Polymer Bulletin (Berlin)* 10(1-2), p. 28-30 and (6), p.251 and *European Polymer Journal* 20(12), p. 1151-1153, and crosslinking silane-terminated polybutadiene using a similar process in German Patent Application No. 3,342,766 and French Patent Application No. 2,536,751

In U.S. Pat. No. 3,715,246, Sayles discloses propellants made from polybutadiene crosslinked with linear, difunctional siloxanes. A propellant formulation incorporating this binder has increased hydrolytic stability compared to propellants made with polyurethane binders. WO 9010037 discloses using a linear siloxane or a cyclic siloxane for crosslinking hydrocarbon polymers in the presence of a hydrosilation catalyst.

Cowan, in U.S. Pat. No. 4,877,820, describes crosslinkable and crosslinked linear poly(organohydrosilanes) wherein the crosslinking units are derived from polycyclic polyenes. Leibfried, in U.S. Pat. Nos. 4,900,779; 4,902,731; 5,013,809 and 5,124,423, describes crosslinkable and crosslinked polymers prepared using polycyclic polyenes and cyclic siloxanes or tetrahedral siloxysilanes. Bard & Burnier, in U.S. Pat. Nos. 5,008,360 and 5,068,303, describe crosslinkable and crosslinked compositions prepared using polycyclic polyenes, a cyclic polysiloxane or a tetrahedral siloxysilane, and compounds having at least two carbon-carbon double bonds.

In U.S. Pat. No. 5,242,979, Barnum and Brady disclose polymeric compositions comprising crosslinked organosilicon polymers and a discontinuous phase of a low molecular weight hydrocarbon elastomer having at least two hydrosilation reactable double bonds.

In U.S. Pat. No. 5,171,817, Barnum and Brady disclose polymeric compositions comprising crosslinked organosilicon polymers and a discontinuous phase of a low molecular weight hydrocarbon elastomer having at least two hydrosilation reactable double bonds.

Co-pending patent application Ser. No. 135,485, filed Oct. 13, 1993, discloses crosslinkable and crosslinked polyphenylene oxide compositions comprising a silicon compound and a polyphenylene oxide.

SUMMARY OF THE INVENTION

The present invention pertains, in one embodiment, to a crosslinkable or crosslinked composition comprising a crosslinkable organosilicon prepolymer and an unsaturated elastomeric polymer. The organosilicon prepolymer has at least two hydrosilation reactive $\equiv$SiH groups, and the polymer has at least two hydrosilation reactive unsaturated carbon-carbon bonds. Further, at least one of the silicon compound and the polymer has more than two hydrosilation reactive sites. The crosslinkable organosilicon prepolymer preferably comprises the hydrosilation reaction product of a monomeric or oligomeric polyene and a silicon compound.

In another embodiment, the present invention pertains to a crosslinkable or crosslinked composition comprising the reaction product of polyene, a silicon compound, and an unsaturated elastomeric polymer. The silicon compound has at least two hydrosilation reactive $\equiv$SiH groups; the polyene has at least two hydrosilation reactive carbon-carbon double bonds; and the polyolefin has at least one hydrosilation reactive unsaturated carbon-carbon bond; further, at least one of the polyene, silicon compound, and polyolefin has more than two hydrosilation reactive sites.

The invention additionally pertains to crosslinked compositions comprising the hydrosilation reaction products of the foregoing crosslinkable compositions and to processes for preparing these crosslinked compositions, comprising effecting hydrosilation of the reactants comprising the crosslinkable compositions. As yet another embodiment, the invention pertains to articles of manufacture comprising the crosslinked compositions of the invention in the form of coated or encapsulated electronic components, and prepregs and laminates for printed circuit boards.

DETAILED DESCRIPTION OF THE INVENTION

The term "polyene," as used herein, refers to molecules having at least two carbon-carbon double bonds. The term "monomeric or olgomeric polyene" refers to polyenes which either are not polymers or are polymer intermediates containing no more than ten monomer units.

The term "prepolymer", as used herein, refers to any liquid or solid hydrosilation crosslinkable composition that has been partially cured, but has not been cured up to or beyond its gel point (gel point is the point at which a material will no longer flow when heated, and is no longer soluble in organic solvents), typically having 5% to 60% of the available $\equiv$SiH groups reacted.

The term "crosslinked", as used herein, encompasses states of full crosslinking as well as partial crosslinking. In this regard, crosslinked compositions include compositions which retain unreacted crosslinkable sites—e.g., with respect to hydrosilation, unreacted hydrosilation reactive $\equiv$SiH groups, and unreacted hydrosilation reactive unsaturated carbon-carbon bonds. The crosslinking reaction, as discussed herein, encompasses hydrosilation, i.e., the reaction of hydrosilation reactive $\equiv$SiH groups and hydrosilation reactive unsaturated carbon-carbon bonds.

As used herein, the terms, "aliphatic", "cycloaliphatic", and "aromatic", unless stated otherwise, are understood as including the alkyl, cycloalkyl, and aryl groups, respectively. Further, "aliphatic", "cycloaliphatic", and "aromatic" are understood as including both nonsubstituted aliphatic, cycloaliphatic, and aromatic groups, and substituted aliphatic, cycloaliphatic, and aromatic groups, with the latter referring to the aliphatic, cycloaliphatic and aromatic portion bearing additional substituents besides the carbon and hydrogen.

The term "silicon compound", as used herein, encompasses organosilicon compounds containing carbon in addition to the silicon.

The monomeric or oligomeric polyenes suitable for the invention include those having at least two hydrosilation reactive carbon-carbon double bonds. Preferred among such polyenes are the polycyclic polyenes, including those as disclosed in LEIBFRIED '779, U.S. Pat. No. 4,900,779, LEIBFRIED '731, U.S. Pat. No. 4,902,731, BARD et al. '360, U.S. Pat. No. 5,008,360, LEIBFRIED '809, U.S. Pat. No. 5,013,809, Cowan '820, U.S. Pat. No. 4,877,820, BARD et al. '303, U.S. Pat. No. 5,068,303, BARNUM et al. '979 and '817, U.S. Pat. Nos. 5,242,979 and 5,171,817, LEIBFRIED et al. '945, U.S. Pat. No. 5,147,945, LEIBFRIED '423, '375 and 498, U.S. Pat. Nos. 5,124,423; 5,124,375; and 5,196,498, and BABCOCK et al. '536, U.S. Pat. No. 5,298,536, these patents being incorporated herein in their entireties, by reference thereto.

The preferred polycyclic polyenes are polycyclic hydrocarbon compounds having at least two non-aromatic carbon-carbon double bonds. Exemplary compounds include cyclopentadiene oligomers (e.g., dicyclopentadiene, tricyclopentadiene, and tetracyclopentadiene), norbornadiene and its Diels-Alder oligomers with cyclopentadiene (e.g., dimethanohexahydronaphthalene), norbornadiene dimer, hexahydronaphthalene, and substituted derivatives of any of these, e.g., methyl dicyclopentadienes. Dicyclopentadiene (also referred to herein as DCPD) is preferred. Two or more polycyclic polyenes can be used in combination.

The silicon compounds of the invention include those having at least two hydrosilation reactive ≡SiH groups. Appropriate silicon compounds include such compounds as cyclic polysiloxanes, tetrasiloxysilanes, linear polysiloxanes, and crosslinkable organosilicon prepolymers, with two or more hydrogen atoms bound to silicon, particularly, with at least two hydrosilation reactive ≡SiH groups. Two or more suitable silicon compounds can be used in combination; particularly, one or more such cyclic polysiloxanes, and/or one or more such tetrasiloxysilanes, and/or one or more such linear polysiloxanes, may be employed. In addition, at least one of (a) the organosilicon compounds or (b) the unsaturated polyolefin has more than two reactive sites. A reactive site with respect to an organosilicon compound is an ≡SiH group, and with respect to the unsaturated polyolefin is a carbon-carbon double bond.

Suitable such silicon compounds include those disclosed in LEIBFRIED '779, LEIBFRIED '731, LEIBFRIED '809, LEIBFRIED '423, LEIBFRIED '375, LEIBFRIED '498, BARD et al. '360, BARD et al. '303, BARNUM et al. '979 and '817, LEIBFRIED et al. '945, in COWAN, '820, LEIBFRIED '134, U.S. Pat. No. 5,077,134, LAMOREAUX '432, U.S. Pat. No. 3,197,432, LAMOREAUX '433, U.S. Pat. No. 3,197,433, and LAMOREAUX '936, U.S. Pat. No. 3,438,936, which are incorporated herein in their entireties, by reference thereto.

Preferred cyclic polysiloxanes include those having the general formula:

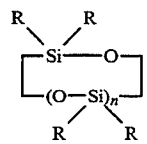

wherein R, which can be the same or different, is hydrogen, or a saturated, substituted, or unsubstituted alkyl or alkoxy radical, or a substituted or unsubstituted aromatic or aryloxy radical, n is an integer from 2 to about 20, and R is hydrogen on at least two of the silicon atoms in the molecule. Preferred R's are hydrogen, methyl, ethyl, phenyl and octyl.

The methylhydrocyclosiloxanes (also referred to herein as MHCS), and mixtures thereof, are suitable such cyclic polysiloxanes. Examples include, e.g., tetraoctylcyclotetrasiloxane, and hexamethylcyclotetrasiloxane; tetra- and pentamethylcyclotetrasiloxanes; tetra-, penta-, hexa-and heptamethylcyclopentasiloxanes; tetra-, penta- and hexamethylcyclohexasiloxanes, tetraethylcyclotetrasiloxanes, and tetraphenylcyclotetrasiloxanes. Preferred are 1,3,5,7-tetramethylcyclotetrasiloxane, 1,3,5,7,9-pentamethylcyclopentasiloxane, and 1,3,5,7,9,11-hexamethylcyclohexasiloxane, or blends thereof.

Most preferably, the silicon compound comprises a plurality of methylhydrocyclosiloxanes or $C_2$-$C_{18}$ alkylmethylmethylhydrocyclosiloxanes. Specifically, in a majority of cases, what is used is indeed a mixture of a number of species wherein n can vary widely, and reference hereinafter to MHCS can refer to such a mixture.

Generally, commercial MHCS mixtures contain up to about 20% (in purer forms, as low as 2%) low molecular weight linear methylhydrosiloxanes, such as heptamethyltrisiloxane, octamethyltetrasiloxane, etc.

One suitable commercial MHCS mixture is Huls M8830 MHCS, available from Huls America, Bristol, Pa.

The tetrasiloxysilanes are represented by the general formula:

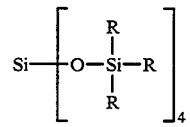

wherein R is as defined above and is hydrogen on at least two of the silicon atoms in the molecule.

Examples include, e.g., tetrakisdimethylsiloxysilane, tetrakisdiphenylsiloxysilane, and tetrakisdiethylsiloxysilane. Tetrakisdimethylsiloxysilane is the best known and preferred species in this group.

Appropriate linear polysiloxanes include those having the general formula:

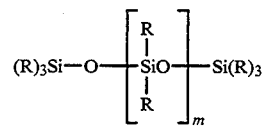

wherein R, which can be the same or different, is hydrogen, or a substituted or unsubstituted saturated alkyl radical, or a substituted or unsubstituted phenyl radical, at least two R's are hydrogen, and m is an integer from about 0 to 1000.

For the linear poly(organohydrosiloxanes) of the above formula at least two R's are hydrogen. The remaining preferably are substituted or unsubstituted saturated alkyl radicals or substituted or unsubstituted phenyl radicals, and m is an integer from about 5 to about 1000, or preferably about 5 to about 100, and the maximum value of m is most preferably about 60.

The linear polysiloxanes often contain minor amounts of branched polysiloxanes as impurities. Included among such branched polysiloxanes are those having the general formula:

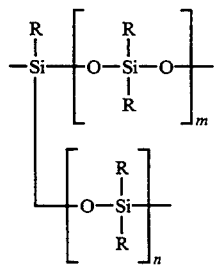

wherein R and m are as defined above for linear polysiloxanes, and n is an integer from about 3 to 100. Where, in such branched polysiloxanes, at least two R's in the molecule are indeed hydrogen, these branched polysiloxanes are within the scope of the invention. Such branched polysiloxanes, and linear polysiloxanes containing such branched polysiloxanes, e.g., in minor amounts, are to be considered as equivalent to linear polysiloxanes, and to be considered as within the scope of linear polysiloxanes, for the purposes of this invention.

Further as to linear polysiloxanes of the invention, suitable such linear polysiloxanes include the linear, short chain ≡SiH terminated polysiloxanes having the general formula:

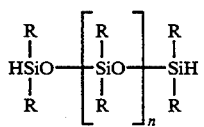

wherein n is 0 to 1000 and R is alkyl or aryl, preferably methyl or phenyl, as disclosed in LEIBFRIED '134 and LEIBFRIED '809.

These linear, short chain ≡SiH terminated polysiloxanes impart flexibility to the cured compositions, and can be used to produce elastomers. As examples of such polysiloxanes, disiloxanes, trisiloxanes, and other short siloxane oligomers, such as hexamethyltrisiloxane, are useful to lower viscosity, particularly for transfer molding operations where low viscosity is most desirable.

Exemplary linear poly(organohydrosiloxanes) include: trimethylsiloxy terminated methylhydropolysiloxane, trimethylsiloxy terminated dimethylsiloxanemethylhydrosiloxane copolymer, dimethylsiloxy terminated dimethylsiloxanemethylhydrosiloxane copolymer, dimethylsiloxy terminated polydimethylsiloxane, trimethylsiloxy terminated methyloctylsiloxanemethylhydrosiloxane copolymer, dimethylsiloxy terminated phenylmethylsiloxanemethylhydrosiloxane copolymer, trimethylsiloxy terminated methylcyanopropylsiloxanemethylhydrosiloxane copolymer, trimethylsiloxy terminated 3,3,3-trifluoropropylmethylsiloxanemethylhydrosiloxane copolymer, trimethylsiloxy terminated 3-aminopropylmethylsiloxanemethylhydrosiloxane copolymer, trimethylsiloxy terminated 2-phenylethylmethylsiloxanemethylhydrosiloxane copolymer, and trimethylsiloxy terminated 2-(4-methylphenyl)-ethylmethylsiloxanemethylhydrosiloxane copolymer.

The term "elastomeric polymer" as used herein refers to rubbery polymers above their glass transition temperature, having low crystallinity in the undeformed state and capable of undergoing large deformations of several hundred percent and then of recovering essentially completely when the stresses are removed. A discussion of the mechanical properties of elastomeric materials can be found in *Kirk-Othmer Encyclopedia of Chemical Technology*, Volume 8, Third Edition, pages 447–452, this reference being incorporated herein in its entirety by reference thereto. As used herein the term "elastomeric polymer" further comprises structures as described above for "elastomeric polymer" wherein the molecular weight is low enough, generally below 5000, for the materials to be liquids.

One type of unsaturated elastomeric polymer that can be employed in the preparation of the crosslinkable or crosslinked polymer compositions of this invention has the general formula:

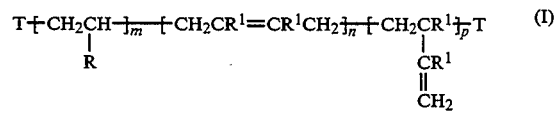

where R is phenyl, nitrile, carboxy, carbalkoxy, carboxamide, hydroxy, alkoxy, epoxy, silane or siloxy; $R^1$ is hydrogen, alkyl, or halogen; T is hydrogen, carboxy, carbalkoxy, carboxamide, hydroxy, alkoxy, epoxy, silane or siloxy; the sum of m, n and p is at least 10, and at least one of n and p is greater than 0.

Preferably each of m, n and p is 0–1,000 and more preferably 0–100. Most preferably, m and n are essentially 0, $R^1$ is hydrogen and p is about 20 to about 60.

Examples of the unsaturated elastomeric polymers of formula I are poly-1,2-butadiene, poly-1,4-butadiene, poly-3-methylbutadiene (polyisoprene), poly-3-chlorobutadiene, styrene-butadiene copolymers and acrylonitrile-butadiene copolymers. The most preferred of these unsaturated polymers is poly-1,2-butadiene, where $R^1$ is hydrogen, p is about 20 to about 60 and m and n are approaching zero.

Cyclized polyisoprene can also be used as the unsaturated elastomeric polymer. This material may contain blocks of 1,2-isoprene segments that have been cyclized thermally, either during or after polymerization, by the addition of acids or Lewis acids to produce fused rings. The synthesis of polymers cyclized during polymerization is described in G. Kaszas et al., *J. Applied Poly. Sci.* 39, 119–144 (1990), which is incorporated by reference in its entirety. The synthesis of cyclized rubber by acid treatment of natural rubber or polyisoprene is described in *Encyclopedia of Polymer Science and Technology*, Volume 14, pages 764–765, this reference being incorporated herein in its entirety by reference thereto. Cyclized polyisoprene increases the flexural modulus and glass transition temperature of the cured composition.

Another class of unsaturated elastomeric polymer that can be employed is terpolymers of ethylene and propylene with diolefins such as dicyclopentadiene, butadienes, bicycloheptadiene, cyclooctadiene and vinylcyclohexene (EPDM elastomers). The general formula for such materials is as follows:

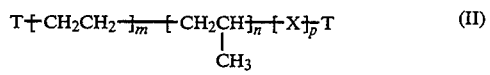

where X is —$CH_2CH(R)$— and R is vinyl or cyclohexenyl, or X is:

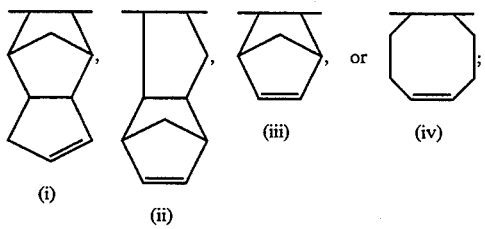

T is as described above; the sum of m, n and p is at least 10, and none of m, n and p is zero. Preferably each of m and n is 1–1,000 and p is 1–200; more preferably each of m and n is 1–100 and p is 1–20; most preferably each of m and n is 1–50 and p is 1–10.

Any of the unsaturated elastomeric polymers of formulas I and II can be block or random copolymers.

The reactions for forming the crosslinkable organosilicon polymers and for forming crosslinked polymers can be promoted thermally, or by the addition of a hydrosilation catalyst or a free radical generator such as a peroxide or an azo compound. Hydrosilation catalysts include metal salts and complexes of Group VIII elements. The preferred hydrosilation catalysts contain platinum, e.g., chloroplatinic acid ($H_2PtCl_6.6H_2O$). Other platinum compounds can also be used to advantage in some instances, e.g., $PtCl_2$ and dibenzonitrile platinum dichloride. Platinum on carbon is also effective for carrying out high temperature polymerizations. Other useful platinum catalysts are disclosed in, e.g., U.S. Pat. Nos. 3,220,972; 3,715,334; and 3,159,662. An exhaustive discussion of the catalysis of hydrosilation can be found in *Advances in Organomotallic Chemistry*, Vol. 17, beginning on page 407. Catalyst concentrations of 0.0005 to about 0.05% by weight, based on the weight of the reactants, will effect smooth and substantially complete polymerization.

The hydrosilation catalyst, where employed, is preferably provided in an amount of about 5–60 ppm, based on the total weight of the crosslinkable composition.

The hydrosilation catalysts include metal salts and complexes of Group VIII elements. The preferred hydrosilation catalysts contain platinum (e.g., $PtCl_2$, dibenzonitrile platinum dichloride, platinum on carbon, dichloro (1,2-cyclooctadiene) platinum (II) [(COD)$PtCl_2$], available from Strem Chemicals, Inc., Newburyport, Mass., etc.).

One such platinum catalyst which is suitable, in terms of both reactivity and cost, is chloroplatinic acid ($H_2PtCl_6.6H_2O$); also appropriate are the platinum complex of divinyltetramethyldisiloxane, available as PC075 from Huls America, and the platinum-containing catalysts PC072 (a platinum divinyltetramethyldisiloxane complex) and PC085, also available from Huls America. One preferred catalyst is a complex of chloroplatinic acid and dicyclopentadiene, as disclosed, for instance, in LEIBFRIED '779, and in BARD et al. '360. A second preferred catalyst is the indicated (COD)$PtCl_2$. Also suitable, as hydrosilation catalysts for crosslinkable blends of the invention, are those as disclosed in CRIVELLO et al., "Novel Platinum-Containing Initiators for Ring-Opening Polymerizations", *Journal of Polymer Science: Part A: Polymer Chemistry*, Vol.29, pages 1853–1863 (1991); this publication is incorporated herein in its entirety, by reference thereto.

The crosslinkable compositions of the invention can be provided in the form of blends, of the individual components. The crosslinkable blends can be prepared by any suitable means, such as conventional mixing of the requisite components.

The crosslinking reaction can be carried out either in solution or neat, and by any suitable means which will support the hydrosilation reaction. The organosilicon polymers of this invention can be prepared by mixing the reactants and the catalyst and bringing the mixture to a temperature at which the reaction is initiated. Proper temperature conditions are thereafter maintained to achieve the desired state of reaction and product properties, or to drive the reaction to substantial completion. For example, heating at 100° C. for 10 minutes produces a semi-solid material, heating at 150° C. for 30 minutes produces a crosslinked elastomeric material and heating at 170° to 200° C. or higher produces a completely thermoset material. The reaction is typically exothermic and proceeds rapidly so that the composition can gel and become tack-free in seconds.

The linear polymethylhydrosiloxanes that can be used in preparing the polymer compositions of this invention are often not compatible with the liquid unsaturated polymers such as poly-1,2-butadiene. Adding 50 weight % of a solvent such as toluene makes a compatible liquid crosslinkable composition. When more than 5 ppm of a platinum catalyst is added, the composition will gradually crosslink under ambient conditions or with heating to 40°–100° C. to produce a clear gel. The gel can be further crosslinked at higher temperatures to give clear, compatible, crosslinked compositions without residual solvent.

The organosilicon crosslinkers have low vapor pressures and can be used in the compositions of this invention without creating environmental hazards or odors. The compositions can be stored at room temperature if the platinum catalyst is complexed with amines such as tetramethylethylenediamine or diethylenetriamine (DETA) (60 ppm Pt:30 ppm DETA). When heated above 100° C., the stable compositions will crosslink and cure in a normal manner.

Some siloxane copolymers are compatible with the unsaturated polymers of this invention and require little or no added solvent for compatibility. For instance, liquid poly-1,2-butadiene is compatible with a 50/50 polymethylhydrosiloxane/polymethylphenylsiloxane copolymer, which can be crosslinked by the addition of a platinum catalyst. Polydimethylsiloxane/polymethylhydrosiloxane copolymers can be partially or completely compatible with the unsaturated polymers of this invention, depending on molecular weight and the polydimethylsiloxane level in the copolymer.

It is possible, by selection of reactants, reactant concentrations and reaction conditions, to prepare compositions exhibiting a broad range of properties and physical forms. Thus, it has been found possible to prepare liquid formulations, elastomeric materials and glassy polymers. In all of these materials the reactants form a polymer network and there is no discontinuous elastomeric phase. The ratio of carbon-carbon double bonds in the unsaturated polymer to ≡SiH groups in the organosilicon compound(s) can range from 1000:1 for lightly crosslinked elastomeric materials to 0.5:1 for glassy polymers. The preferred ratio is 0.5:1 to 5:1.

The components of the blends are completely stable until they are mixed. This permits indefinite ambient storage of the starting materials.

Alternatively, the components of the blend can be premixed and stirred in a tank. These blends have low viscosity and are pumpable. Addition of catalyst and/or application of heat can be used to cure the blended composition. The reaction can be carried out in an extruder, mold or oven, or the blend can be applied directly to a substrate or electronic part. For the more reactive compositions, mild complexing agents, such as tetramethylethylenediamine or diethylenetriamine, can be added to control the low temperature reaction as described in copending patent application Ser. No. 764,829, filed Sep. 24, 1991, which is incorporated by reference herein in its entirety. The complex dissociates at temperatures greater than 100° C. to let curing proceed. With stronger complexing agents, such as phosphorus compounds, curing temperatures above 150° C. are required. Suitable phosphorus compounds are described in "Phosphorus Based Catalyst Retardants for Silicon Carbon Resin Systems", Research Disclosure 326103 (June 1991), which is incorporated by reference in its entirety.

Although a hydrosilation reaction via the carbon-carbon unsaturation of the unsaturated polymer and the ≡SiH group of organosilicon compound(s) is the primary polymerization and crosslinking mechanism, other types of polymerization and crosslinking can also take place as the curing temperature is increased. These may include, e.g., oxidative crosslinking, free radical polymerization (olefin addition reactions) and condensation of ≡SiH with silanols or water to form siloxane bonds.

In a first embodiment of this invention, the crosslinkable or crosslinked composition comprises a prepolymer, preferably, a crosslinkable prepolymer, and more preferably, a crosslinkable organosilicon prepolymer, and an unsaturated elastomeric polymer having at least two hydrosilation reactive unsaturated carbon-carbon bonds. In a particularly preferred embodiment, monomeric or oligomeric polyene and silicon compound are provided to the crosslinkable composition in the form of the indicated crosslinkable organosilicon prepolymer, which has been prepared by hydrosilation from reactants comprising such monomeric or oligomeric polyene and silicon compound. This crosslinkable composition, including the hydrosilation catalyst, and such prepolymer, as well as polymer, is likewise subjected to the crosslinking procedure.

In a second embodiment of this invention, the crosslinkable or crosslinked composition includes a polyene having at least two hydrosilation reactive carbon-carbon double bonds, besides the unsaturated elastomeric polymer, and the indicated hydrosilation catalyst and silicon compound. Because the polyene has at least two hydrosilation reactive sites, the polymer does not also require two such sites, for the requisite crosslinking to be effected; specifically, polymers with only one hydrosilation reactive unsaturated carbon-carbon bond, as well as those with two or more, may be employed.

Accordingly, in this second embodiment, the unsaturated elastomeric polymer has at least one hydrosilation reactive unsaturated carbon-carbon bond. Consistent with the first embodiment, at least one of the silicon compound, polyene, and polymer has more than two hydrosilation reactive sites, in order to support crosslinking. Crosslinking can be conducted, in the same manner as for the first embodiment.

The same hydrosilation catalysts previously discussed are likewise appropriate for use in preparation of the prepolymer. For those of such catalysts which are platinum catalysts, catalyst concentrations of about 0.0005 to about 0.05% by weight of platinum, based on the weight of monomers, are preferred.

With regard to this first embodiment, if the prepolymer of the crosslinkable composition contains a sufficient amount of the hydrosilation catalyst used in its preparation to effect crosslinking of the composition, then the crosslinked composition of the invention can be obtained without requiring further addition of hydrosilation catalyst. Alternatively, if necessary, the crosslinkable composition can be provided with additional hydrosilation catalyst.

The crosslinkable organosilicon prepolymers suitable for the invention include those prepolymers as disclosed in LEIBFRIED '779, LEIBFRIED '731, LEIBFRIED '134, BARD et al.'360, and COWAN '820. The crosslinkable prepolymers suitable for the invention also include those prepolymers as disclosed in BARD et al. '303, BURNIER '048, U.S. Pat. No. 5,025,048, BURNIER '735, U.S. Pat. No. 5,118,735, and LEIBFRIED '498, in U.S. application Ser. No. 764,829, filed Sep. 24, 1991, now U.S. Pat. No. 5,340,644 and in U.S. application Ser. No. 049,097, filed Apr. 19, 1993, now U.S. Pat. No. 5,334,688; these patents and applications are incorporated herein in their entireties, by reference thereto.

Preferred crosslinkable organosilicon prepolymers are those comprising:
(a) at least one polyene having at least two hydrosilation reactive carbon-carbon double bonds; and
(b) at least one silicon compound, having at least two hydrosilation reactive ≡SiH groups, and comprising at least one member selected from the group consisting of cyclic polysiloxanes, tetrasiloxysilanes, and linear polysiloxanes, wherein at least one of the at least one polyene and the at least one silicon compound has more than two hydrosilation reactive sites. Most preferably, the at least one silicon compound has three or more hydrosilation reactive ≡SiH groups.

Suitable polyenes and silicon compounds, for such prepolymers, include those as discussed herein.

Where the crosslinkable prepolymers, of the invention, are the indicated crosslinkable organosilicon prepolymers, i.e., comprising at least one polyene, and one or more one cyclic polysiloxanes, and/or tetrasiloxysilanes, and/or linear polysiloxanes, as discussed at length above, the ratio of total hydrosilation reactive carbon-carbon double bonds, contributed thereto by the at least one polyene, to hydrosilation reactive ≡SiH groups, contributed thereto by the at least one silicon compound, is preferably regulated according to the intended function of these prepolymers.

Specifically, the prepolymer is formulated for hydrosilation reaction with the polymer where the polymer provides hydrosilation reactive sites. It will participate in the crosslinking, by virtue of such hydrosilation. Because the hydrosilation reactive sites of the polymer are unsaturated carbon-carbon bonds, the prepolymer must provide sufficient hydrosilation reactive ≡SiH groups for reaction therewith, and the relative proportion of hydrosilation reactive sites, contributed by polyene and silicon compound, is determined accordingly.

In view of the foregoing, the prepolymer composition preferably has at least a slight excess of hydrosilation reactive ≡SiH groups over hydrosilation reactive carbon-carbon double bonds. This ratio is preferably in the range of 1.1:1 or larger. Higher molecular weight polymers can be employed, e.g., crosslinked, with only a slight excess of hydrosilation reactive ≡SiH groups available.

Further as to crosslinkable organosilicon prepolymers of the invention, included among such prepolymers are the crosslinkable linear poly(organohydrosiloxane) prepolymers, comprising linear poly(organohydrosiloxane) with hydrosilation reactive ≡SiH groups having been reacted with monomeric or oligomeric polyenes, preferably, polycyclic polyenes. Suitable polyenes, such as polycyclic polyenes, include those as discussed herein.

In these crosslinkable linear poly(organohydrosiloxane) prepolymers, preferably, 5% to 90%—more preferably, at least 30%, and, most preferably, 30% to 60%—of such hydrosilation reactive ≡SiH groups have been thusly reacted with polyene. Appropriate linear poly(organohydrosiloxanes) for these prepolymers, are those as discussed herein, with both the general formula and the exemplary linear poly(organohydrosiloxanes) being applicable.

The crosslinkable prepolymers of the invention can be prepared utilizing the procedures and components, including, but not limited to, process steps and catalysts, as set forth in LEIBFRIED '779, LEIBFRIED '731, LEIBFRIED '134, BARD et al. '360, BARD et al. '303, BURNIER '048, BURNIER '735, and COWAN '820, and in U.S. application Ser. No. 764,829, filed Sep. 24, 1991 now U.S. Pat. No. 5,340,644. The reactions for forming the prepolymer, can be promoted thermally, or by the addition of a hydrosilation catalyst or radical generators such as peroxides and azo compounds.

One approach for preparing, as the crosslinkable prepolymer of the invention, a crosslinkable organosilicon prepolymer as previously discussed, is simply to mix the correct relative ratios of components, i.e., the polyene, silicon compound and hydrosilation catalyst, and then to bring the mixture to a temperature at which the reaction is initiated. Proper temperature conditions are thereafter maintained, to drive the reaction to the degree of completion requisite for obtaining the desired prepolymer.

In this regard, reaction conditions utilized are those which are requisite for obtaining a prepolymer, within the meaning of the term as defined herein, i.e., such polymer being partially cured, but not cured up to or beyond its gel point. For instance, the mixture of the components is maintained at about 30° to 80° C., for several hours, then interrupted at the point where the requisite proportion of available hydrosilation reactive ≡SiH groups have been reacted, preferably, 5% to 60% thereof. More preferably, this polymerization is effected so that, 30% to 60%, and most preferably, 30% to 50%, of available hydrosilation reactive ≡SiH groups have been reacted.

The indicated preparation of prepolymer can be conducted as a two stage procedure. In such an instance, the polyene used in ultimate preparation of the prepolymer is itself first prepared in the same manner as the prepolymer. In this regard, such polyene is obtained by heating a mixture of hydrosilation catalyst, silicon compound, and initial polyene, those polyenes discussed herein being suitable as such initial polyene, to effect the hydrosilation reaction. More specifically, the polyene can be prepared in the manner as set forth in LEIBFRIED '134 and LEIBFRIED '809.

It is noted that besides being suitable in this two stage procedure, i.e., for preparation of the prepolymer of the first embodiment of the present invention, this polyene is likewise suitable, as the polyene for crosslinkable compositions of the invention where the prepolymer is not employed, i.e., in the second embodiment.

For preparation of this polyene, the relative proportions of initial monomeric or oligomeric polyene and silicon compound employed are such that there is a large excess of hydrosilation reactive carbon-carbon double bonds available for reaction with the hydrosilation reactive ≡SiH groups. That is, the ratio of hydrosilation reactive carbon-carbon double bonds of initial polyene, to hydrosilation reactive ≡SiH groups of silicon compound, is between about 2:1 and about 10:1. Excess initial polyene which remains after this reaction is removed by any suitable method, such as conventional stripping, e.g., by distillation under vacuum.

In the resulting polyene, the ratio of total hydrosilation reactive carbon-carbon double bonds contributed thereto by the initial polyene, to hydrosilation reactive ≡SiH groups contributed thereto by the silicon compound, is preferably at least about 1.8:1. More preferably, it is greater than about 1.8:1. Still more preferably, this ratio is greater than about 1.8:1, and up to about 2.2:1. Most preferably, it is greater than about 1.8:1, and up to about 2.0:1.

In the formation of this resulting polyene, the hydrosilation reactive ≡SiH groups, which have been contributed thereto by the silicon compound, are fully, or at least substantially fully, reacted with the hydrosilation-reactive carbon-carbon double bonds which have likewise been contributed by the initial polyene. In this context, "at least substantially fully" means approximately 90%, or more, of the ≡SiH groups have been reacted.

As to such hydrosilation-reactive carbon-carbon double bonds contributed by the initial polyene, those which have not been thusly reacted, with the indicated ≡SiH groups, are available for further hydrosilation. The resulting polyene is accordingly provided with at least two hydrosilation reactive carbon-carbon double bonds.

Of those hydrosilation reactive carbon-carbon double bonds thusly contributed, but not reacted with the ≡SiH groups, such hydrosilation reactive carbon-carbon double bonds which are part of the thusly reacted initial polyene, which, in turn, is now part of the resulting polyene, will accordingly be available for reaction with hydrosilation reactive ≡SiH groups of further silicon compound in the second stage of the indicated two stage procedure. This second stage is preparation of the crosslinkable prepolymer, and can be conducted with such resulting polyene, and such further silicon compound, in the manner for preparing crosslinkable organosilicon prepolymer, as previously discussed.

As to such two stage prepolymer, the ratio of total hydrosilation reactive carbon-carbon double bonds, contributed thereto by such resulting polyene, to hydrosilation reactive ≡SiH groups, contributed thereto by such further silicon compound, will preferably also be the same as previously discussed, with respect to preparation of crosslinkable organosilicon prepolymer.

Particularly as to preparing the crosslinkable linear poly(organohydrosiloxane) prepolymer of the invention, as discussed herein, hydrosilation catalyst and polycyclic polyene are mixed and heated to form a complex. This complex and the poly(organohydrosiloxane) are thereafter combined, and, as with respect to the previously discussed organosilicon prepolymer, suitable reaction conditions are utilized to obtain the requisite prepolymer.

Particularly, the reaction mixture is heated to about 30° to 80° C.; as previously discussed with reference to preparation of the organosilicon crosslinkable prepolymer, the reaction temperature is thusly maintained for several hours, then interrupted at the point where the requisite proportion of available hydrosilation reactive ≡SiH groups have been reacted—preferably, for this poly(organohydrosiloxane) prepolymer, 5% to 60% thereof. More preferably, the polymerization is effected so that 30% to 60%, of such available hydrosilation reactive ≡SiH groups, have been reacted.

As to the immediately following discussion, concerning suitable polycyclic polyenes for obtaining the requisite poly(organohydrosiloxane) prepolymer from the indicated lower temperature reaction, such discussion is provided according to the best understanding of this matter at the present. This discussion is not intended to limit the scope of the invention.

Specifically, so that the requisite poly(organohydrosiloxane) prepolymer, preferably being flowable and heat curable, can be obtained from such lower temperature reaction, even though the ratio of hydrosilation reactive carbon-carbon double bonds to hydrosilation reactive ≡SiH groups is otherwise suitable for obtaining the crosslinked polymer, it appears that an appropriate polycyclic polyene is required. Suitable such polycyclic polyenes are those having chemically distinguishable hydrosilation reactive carbon-carbon double bonds, i.e., one such bond being more reactive during hydrosilation than the other. These polycyclic polyenes include, for example, cyclopentadiene oligomers such as dicyclopentadiene and cyclopentadiene trimer, and methyl dicyclopentadiene.

Crosslinking, for the second embodiment, can be conducted according to the same conditions as utilized for the first embodiment.

Generally as to the relative proportions and the types of components chosen from those taught above for use in preparing the crosslinkable and crosslinked compositions of the invention, these can be determined without undue experimentation, by those of ordinary skill in the art, according to a variety of factors. Such factors include, but are not limited to, the compatibility of such components, whether they will react with one another, where they will react with one another, the stoichiometry of the reactions which occur. Still additional factors concern the properties desired in the curable blend and cured product.

In this regard, one set of proportions to consider is the ratio of hydrosilation reactive carbon-carbon double bonds to hydrosilation reactive ≡SiH groups, ultimately contributed from polyene (when present) and the silicon compound, in preparing the compositions of the invention—whether contributed to preparation of the prepolymer, or to the final, crosslinked product. This ratio is preferably in the range of about 0.1:1 to about 1.5:1; more preferably, this ratio is in the range of about 0.5:1 to about 1.2:1; still more preferably, this ratio is in the range of about 0.8:1 to about 1.2:1. Most preferably, this ratio is 1:1.1, or slightly larger.

As to the specified most preferred range of 1:1.1, or slightly larger, considerations stated with respect to the preferred hydrosilation site ratios, for the crosslinkable prepolymers, are likewise of general applicability. There must be sufficient hydrosilation reactive ≡SiH groups, available for reaction with the hydrosilation reactive unsaturated carbon-carbon bonds of the polymer. Accordingly, at least a slight excess of the ≡SiH groups is preferred. Also as noted, with respect to the discussion of hydrosilation site ratios for the crosslinkable prepolymers, the suitability of higher molecular weight polymers for crosslinking, where only a slight excess of hydrosilation reactive ≡SiH groups are available, is likewise of general applicability.

Particularly as to the amount of unsaturated elastomeric polymer relative to the other components, this amount is not critical. The minimum amount of hydrosilation reactive components to be used, other than polymer is that which will still permit crosslinking to be effected, this amount being about 1% by weight of the composition. Accordingly, up to about 99% by weight polymer may be employed. The maximum amount of components other than polymer is that which will maintain the desirable properties afforded to the composition, by the presence of the polymer. This amount is about 60% by weight of the composition, consequently providing 40% by weight, as being the minimum amount of polymer preferably to be present.

Another set of proportions to consider is what percent of the reactive ≡SiH groups must necessarily react to accomplish the crosslinking of the unsaturated elastomeric polymer. This percentage is variable and depends largely on the molecular weight of the elastomeric polymer to be crosslinked. That is, the higher the molecular weight of the polymer, the smaller the is the percentage of the reactive ≡SiH required to react. For the lowest molecular weight elastomeric polymers, e.g. liquid polybutadiene, at least 40%, and preferably 60% of the reactive ≡SiH groups are required to react. For the highest molecular weight polymers, e.g., natural rubber, as little as 5%, preferably 25% may be required to react.

Yet further components, other than those previously specified, may be included in the invention. Such components may be provided to the crosslinkable compositions of the invention, and/or, where a prepolymer is employed, in preparation of such prepolymer, depending upon the properties of the components and prepolymer. Further as to such additional components, it is understood that those particular additional components, which are specifically discussed, are not provided by way of limitation, and that yet others, not specifically described, may also be suitable.

For instance, what is identified, in LEIBFRIED '498, as the at least one second silicon compound, is a suitable such additional component. This component is particularly noted as one which can be provided to curable blends of the invention as a starting material, and/or employed in preparation of prepolymer.

Other yet additional further components include reaction rate modifiers, as disclosed in U.S. application Ser. No. 764,829, filed Sep. 24, 1991, now U.S. Pat. No. 5,340,644 which is incorporated herein in its entirety, by reference thereto.

Still additional further components include flame retardants such as phosphorus compounds and residues, e.g., ammonium polyphosphate, and halogen containing compounds and residues, e.g., hexachlorocyclopentadiene, as disclosed in BABCOCK et al. '536 and in U.S. application Ser. No.'s 125,887 and 125,886, both filed Sep. 24, 1993. This patent and these applications are also incorporated herein in their entirety, by reference thereto.

As yet further examples of additional components, carbon black, carbon (graphite), quartz, aramid, and other polymeric fibers may be included in the curable blends of the invention. These materials are wetted very well by the liquid prepolymers of the invention, making them excellent matrix materials. Fiber can be in non-woven, unidirectional, woven, fabric, etc., form. Suitable fibers and prepregs include those as discussed in BARD '360.

Additives such as fillers and pigments are also readily incorporated. Vermiculite, mica, wollastonite, calcium carbonate, sand, silica, fumed silica, fused silica, ceramic beads, hollow glass, glass spheres, glass beads, ground glass, waste glass and other mineral fillers are examples of fillers which can be incorporated. Fillers can serve either as reinforcement or as fillers and extenders to reduce the cost of the molded product. Glass spheres, in particular, are useful for preparing low density composites. Fillers can also be used for other reasons, such as viscosity modification. Fillers can be present in amounts up to about 15% by weight of the crosslinkable compositions of the invention, and in even higher amounts, i.e., up to about 95% by weight, when glass fibers are not used.

In this regard, especially useful reinforcing fillers are spherical particles of fused silica, which can be included up to about 95% by weight. Heat conducting ceramic fillers can be used up to about 90% by weight; these are useful in electronic encapsulants, to remove heat from electronic devices.

Stabilizers (anti-oxidants, antiozonants, thermal and light stabilizers) are useful to maintain storage stability of the monomers, prepolymers, and polymers, in crosslinkable compositions of the invention, and also to maintain the thermal and oxidative stability, of the crosslinked products. Among the preferred stabilizers are radical scavengers such as hindered phenols in combination with other stabilizers. Especially useful examples include bis(1,2,2,6,6-pentamethyl-4-piperidinyl)-(3,5-di-tert-butyl-4-hydroxybenzyl)butylpropanedioate (available as Tinuvin TM 144 from Ciba-Geigy Corp., Hawthorne, N.Y.), or a combination of octadecyl 3,5-di-tert-butyl-4-hydroxyhydrocinnamate (also known as octadecyl 3-(3',5'-di-tert-butyl-4'-hydroxyphenyl) propionate) (available as Naugard TM 76 from Uniroyal Chemical Co., Middlebury, Conn.) and bis(1,2,2,6,6-pentamethyl-4-piperidinyl-sebacate) (available as Tinuvin TM 765 from Ciba-Geigy Corp.). Stabilizers are generally used in an amount of about 0.5% to about 3.0%, based on the weight of the prepolymer of the curable blend. Generally, the stabilizers can be employed as disclosed in BURNIER '048, and in BURNIER '735.

The compositions of this invention can be coated, molded, or compounded to make useful fabricated forms. Coating inorganic, glass, or metal under ambient conditions can provide corrosion protection for costly assemblies. The low polarity compositions provide cohesive and adhesive coatings with very low propensity for the absorption of atmospheric moisture. This and the low dielectric constants make them excellent protective coatings and encapsulants for sensitive electronic parts.

The compositions of this invention may be used for impregnating reinforcements, to obtain reinforced composite articles. Further, they may be coated onto fibers to make composite laminates or prepregs, and fabricated into useful structures. The composite laminates may be clad with a conductive material for further utility as, for example, circuit boards. The fluid compositions will coat glass, aramide or carbon fibers as filaments, mats or cloth and can be partially cured to provide forms which are easily processed into laminates or other composite forms, such as printed circuit board substrates.

The compositions can be injected into dies or molds, to provide rimtruded or molded parts directly. Typically, glass non-woven mats or cloth are placed in the mold and the fluid composition is injected to fill the mold, and cured in place, to make the finished molded part. In the rimtrusion applications, glass or fiber roving is pulled through a die where the fluid polymer formulation is injected under pressure and cured thermally to make a rigid rod out of the roving before it leaves the heat zone of the rimtruder barrel. Rods, beams or other composite constructions can be made continuously by this process.

The article of manufacture of this invention is selected from the group consisting of an electronic component comprising the organosilicon polymer composition or an electronic component coated or encapsulated (potted or sealed) with the composition. The term "electronic component" includes, for example, electronic circuit boards, circuit board laminates, circuit board prepregs, semiconductor devices, capacitors, resistors, diodes, transistors, transformers, coils, wires, hybrid circuits and multichip modules.

Formulations intended for use as electronic encapsulants are preferably produced by blending the low viscosity mixtures of organosilicon compound(s) and unsaturated polymer with fused silica (fused quartz, amorphous silica). Standard crushed silica or spherical silica can also be used. The silica can be natural or synthetic. Low alpha particle grades of fused silica may be desirable for certain applications. The silica particle size distribution is controlled to give the maximum packing of filler, thereby minimizing the thermal expansion of the cured formulation. The desirable range of thermal expansion of the cured formulation is 20–40 ppm/° C. This is achieved by incorporating from about 70 to about 95 wt. % of silica having a particle size of 50% 30 $\mu$m and 50% 12 $\mu$m, and curing in the presence of more than 20 ppm Pt at a temperature greater than 200° C. for 2 hours. Water absorption by the cured formulation after immersion in water for 24 hours at 25° C. is extremely low (<0.2%), thus protecting the electronic component from the effects of corrosion. Other fillers that can be used in encapsulant formulations include alumina, aluminum nitride, silicon carbide and diamond.

In liquid encapsulation, a liquid material is used to cover or surround the electronic component. The material is then cured. The words "glob top encapsulation" and "potting" are often used to describe variations of liquid encapsulation.

In contrast, transfer molding operations utilize a pellet or powder that is generally solid at room temperature. In transfer molding encapsulation, an integrated circuit (IC) is typically bonded to a lead frame with an adhesive, often a silver-filled epoxy. Connections are made from the bond pads on the chip to the lead frame with wire bonding. The lead frame is then placed in a transfer molding press. Transfer molding compound in powder or pellet form is placed in the pot of the molding machine and is plunged into the heated mold. The material cures to form a molded package around the IC and the parts are removed from the mold. The parts are usually post-cured for several hours at 150°-180° C. A detailed description of transfer molding technology can be found in L. T. Manzione, *Introduction to Plastic Packaging of Microelectronic Devices*, Van Nostrand Reinhold, New York, 1990.

A variety of substrates can be protected by encapsulation. Substrates can be made from, for example, polymers, reinforced polymers, ceramics, silicon, or thin film dielectrics of organic or inorganic materials on ceramic or silicon.

The invention is illustrated by the following Examples, which are provided for the purpose of representation, and are not to be construed as limiting the scope of the invention. Unless stated otherwise, all percentages, parts, etc. are by weight.

EXAMPLE 1

This example describes the preparation of methylhydrosiloxane/dicyclopentadiene (MHCS/DCPD) prepolymer.

Dicyclopentadiene, 50 parts was diluted with 20 parts of toluene, and then 0.00078 parts of platinum (15.6 ppm based on DCPD) in the form of a solution of chloroplatinic acid in isopropanol (solution containing 1.73% platinum) was added. The resulting solution was then heated at ~65° C. for about 1 hour with stirring.

The above solution was then added dropwise to 102.3 parts of MHCS in a 3-neck round bottom reactor heated to ~55° C. The addition rate (total time of addition ~3 hours) was controlled to maintain a slight exotherm but prevented from rising above 75° C. After addition was completed the mixture was maintained at ~60° C. for 30 minutes and then stirred at ambient temperature overnight. The resulting mixture, 170.5 parts, was then stripped of toluene and unreacted MHCS under vacuum at ~65° C. to yield 129 parts of viscous material. Diethylene triamine (DETA), 4 ppm based on final weight, was then added as a stabilizer. The Brookfield viscosity was 46 cps.

Analysis by size exclusion chromatography (SEC) indicated a weight average molecular weight of 396, a Z average molecular weight of 421, dispersity of 1.04 and a peak molecular weight of 361.

Analysis by supercritical fluid chromatography (SCF) showed 45.65% monosubstituted, 47.8% disubstituted and 4.6% trisubstituted cyclosiloxane material.

EXAMPLE 2

This example describes the preparation of methylhydrocyclosiloxane/octene (MHCS/octene) prepolymer.

Octene-1, 50 parts, was diluted with 20 parts of toluene, and then 0.077 parts of platinum (15.5 ppm based on octene) in the form of a solution of chloroplatinic acid in isopropanol (solution containing 1.73% platinum) was added. The resulting solution was then heated at ~65° C. for about 1 hour with stirring.

The above solution was then added dropwise to 120.5 parts of MHCS in a 3-neck round bottom reactor heated to ~55° C. The addition rate (total time of addition ~3 hours) was controlled to maintain a slight exotherm but prevented from rising above 65° C. After addition was completed the mixture was maintained at ~55° C. for 1 hour, cooled to ambient temperature, and then DETA, (10 ppm based on octene) was added. The resulting mixture, 188 parts, was then stripped of toluene and unreacted octene under vacuum at ~65° C. to yield 133 parts of clear fluid product. The Brookfield viscosity was 8 cps.

Analysis by SEC indicated a weight average molecular weight of 540, a Z average molecular weight of 569, dispersity of 1.05 and a peak molecular weight of 476.

Analysis by SCF showed 41.84% monosubstituted, 46.6% disubstituted and 6.3% trisubstituted cyclosiloxane material.

EXAMPLE 3

This example describes the crosslinking of polybutadiene with MHCS/DCPD prepolymer.

Liquid polybutadiene (Nisso-PB, mole wt. 2000, Nissho Iwai American Corporation, New York, N.Y.)), 5.07 parts, was mixed with 11.86 parts of the MHCS/DCPD prepolymer of Example 1, 7.15 meq SiH/g., and 30 ppm platinum in the form of PC072 (Huls America, Bristol, Pa.)) was added. The mixture was degassed in a bell jar under vacuum and then poured (7.5 parts) into open-face Teflon molds. Cure conditions were 50° C. for 1 hour, 110° C. for 4 hours and 165° C. for 2 hours. The clear, hard, void free resin lost only 1.5 wt. % on curing.

Thermal expansion data were as follows:

| from 60° C. to 100° C. | 134 $\mu$M/M/°C. |
|---|---|
| −50° C. to 0° C. | 93.5 $\mu$M/M/°C. |

EXAMPLE 4

This example demonstrates the use of a filler in crosslinking polybutadiene with MHCS/DCPD prepolymer.

The liquid polybutadiene/MHCS-DCPD prepolymer mixture of Example 3 was mixed with silica at a level such that the final blend was 75 wt. % silica. The molding conditions were the same as those of Example 3. There was only a negligible weight loss or shrinkage in the cured material.

Thermal expansion data were as follows:

| from 60° C. to 100° C. | 45.3 $\mu$M/M/°C. |
|---|---|
| −50° C. to 0° C. | 30.75 $\mu$M/M/°C. |

The glass transition temperature was 100.9° C.

EXAMPLE 5

This example describes the crosslinking of polybutadiene with octene modified MHCS.

Liquid polybutadiene (mole wt. 2000), 5.08 parts, was mixed with 10.3 parts of the octene modified MHCS of Example 2, 8.25 meq SiH/g., and 31 ppm platinum, in the form of PC072 was added. The mixture was degassed in a bell jar under vacuum and then poured (8.0 parts) into open-face Teflon molds. Cure conditions were 50° C. for 1 hour, 110° C. for 4 hours and 165° C. for 2 hours. The clear, hard, void free, brittle resin lost only 2.0 wt. % on curing.

Thermal expansion data were as follows:

| from 60° C. to 100° C. | 189 μM/M/°C. |
|---|---|
| −50° C. to 0° C. | 143 μM/M/°C. |

EXAMPLE 6

This example demonstrates the use of a filler in crosslinking polybutadiene with MHCS/octene prepolymer.

The liquid polybutadiene/MHCS-octene prepolymer mixture of Example 5 was mixed with silica at a level such that the final blend was 75 wt. % silica. The molding conditions were the same as those of Example 5. There was only a negligible weight loss or shrinkage in the cured material.

Thermal expansion data were as follows:

| from 60° C. to 100° C. | 53.0 μM/M/°C. |
|---|---|
| −50° C to 0° C. | 41.1 μM/M/°C. |

EXAMPLE 7

This example describes preparation of prepolymer from linear polymethylhydrosiloxane and dicyclopentadiene.

A solution of 185 parts of dicyclopentadiene, 11.8 parts of toluene and 1.01 parts of (COD)PtCl$_2$ (0.25% platinum in methylethyl ketone solution, Strem Chemicals, Newburyport, Mass.) was added over 2.5 hours to 175 parts of linear polymethylhydrosiloxane (GE DF1040 fluid, General Electric, Waterford, N.Y.) dissolved in 143 parts of toluene while the temperature was controlled at 65° C. with cooling. The completion of the hydrosilation reaction was determined by the disappearance of the DCPD norbornene olefin infrared absorbance band at 1340 cm$^{-1}$. Stabilizers (6.8 parts Naugard 76 antioxidant, Uniroyal Chemical, Middlebury, Conn. and 1.4 parts Tinuvin 765 UV stabilizer, Ciba-Geigy Corp., Hawthorne, N.Y.) and a platinum complexing agent, 0.3 parts of diethylenetriamine) were then added. The DETA complex of the platinum provides storage stability for the prepolymer.

EXAMPLE 8

This example describes crosslinking polybutadiene with a prepolymer from linear polymethylhydrosiloxane and dicyclopentadiene.

Liquid polybutadiene of molecular weight 2000, 5.04 parts was mixed with 5.04 parts of the prepolymer prepared in Example 7 (3.076 meq. SiH/g.). The blend was hazy, but did not phase separate upon standing. To the blend was added 30.6 ppm platinum in the form of dilute PC072. The resulting mixture was degassed under vacuum in a bell jar, poured into two open face Teflon molds, and then degassed again. Cure conditions were 50° C. for 1 hour, 110° C. for 4 hours and 165° C. for 2 hours. The clear, flexible, rubbery resin lost ~7.4 wt. % on curing. On post curing (110° C. for 4 hours, 160° C. for 2 hours, 200° C. for 1 hour) the sample lost an additional 0.6 wt. % and became less rubbery. This postcured piece expanded 198 μM/M/° C. from 60° C. to 100° C., and 30° C. to 246° C. The glass transition temperature was 9° C. The postcured sample lost 0.01 wt. % after soaking for 24 hours in room temperature water, but increased 0.09 wt. % after 24 hours at 95° C.

While the invention has been described with respect to specific embodiments, it should be understood that they are not intended to be limiting and that many variations and modifications are possible without departing from the scope of this invention.

What is claimed is:

1. A crosslinkable or crosslinked polymer composition comprising the reaction product of:
   (a) an unsaturated elastomeric polymer having at least two hydrosilation reactive carbon-carbon double bonds; and
   (b) a crosslinkable organosilicon prepolymer having at least two hydrosilation reactive ≡SiH groups comprising the hydrosilation reaction product of reactants comprising:
      (i) a monomeric or oligomeric polyene having at least two hydrosilation reactive carbon-carbon double bonds; and
      (ii) a silicon compound having at least two hydrosilation reactive ≡SiH groups; and
   wherein at least one of the polyene and the silicon compound has more than two hydrosilation reactive sites, and at least one of the unsaturated elastomeric polymer and the organosilicon prepolymer has more than two hydrosilation reactive sites; and
   wherein the unsaturated elastomeric polymer is present at a level of at least 40 wt. percent.

2. The crosslinkable or crosslinked polymer composition of claim 1 wherein the unsaturated elastomeric polymer is present at a level of from about 70 to about 99 wt. percent.

3. The crosslinkable or crosslinked polymer composition of claim 1 wherein the unsaturated elastomeric polymer comprises at least one member of the group consisting of:
   (a) unsaturated polymers having the formula:

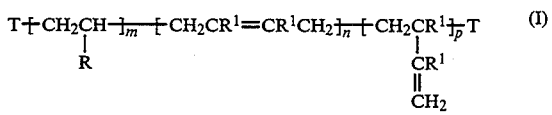

where R is phenyl, nitrile, carboxy, carbalkoxy, carboxamide, hydroxy, alkoxy, epoxy, silane or siloxy; R$^1$ is hydrogen, alkyl, or halogen; T is hydrogen, carboxy, carbalkoxy, carboxamide, hydroxy, alkoxy, epoxy, silane or siloxy; the sum of m, n and p is at least 10, and at least one of n and p is greater than 0;

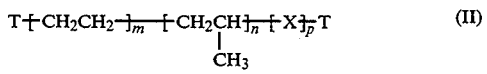

where X is —CH$_2$CH(R)— and R is vinyl or 3-cyclohexenyl, or X is

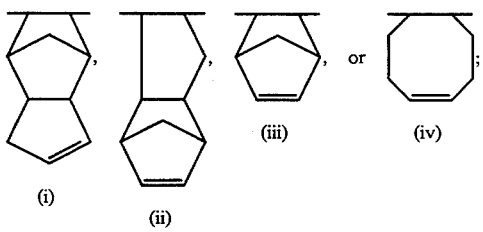

T is as described above; the sum of m, n and p is at least 10, and none of m, n and p is zero; and (c) cyclized polyisoprene.

4. The crosslinkable or crosslinked polymer composition of claim 1 wherein the unsaturated elastomeric polymer comprises an unsaturated polymer having the formula:

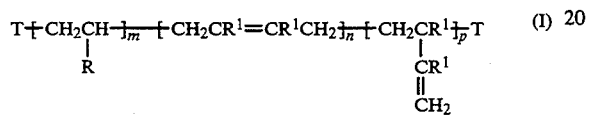

where R is phenyl, nitrile, carboxy, carbalkoxy, carboxamide, hydroxy, alkoxy, epoxy, silane or siloxy; $R^1$ is hydrogen, alkyl, or halogen; T is hydrogen, carboxy, carbalkoxy, carboxamide, hydroxy, alkoxy, epoxy, silane or siloxy; the sum of m, n and p is at least 10; m, n and p are 0–1000, and at least one of n and p is greater than 0.

5. The crosslinkable or crosslinked polymer composition of claim 4 wherein n, m and p are 0–100.

6. The crosslinkable or crosslinked polymer composition of claim 5 wherein $R^1$ is hydrogen, m and n are essentially 0, and p is about 20 to about 60.

7. The crosslinkable or crosslinked polymer composition of claim 1 wherein the unsaturated elastomeric polymer comprises an unsaturated polymer having the formula:

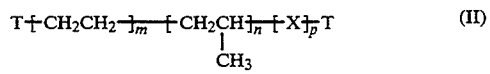

where X is —CH$_2$CH(R)— and R is vinyl or 3-cyclohexenyl, or X is

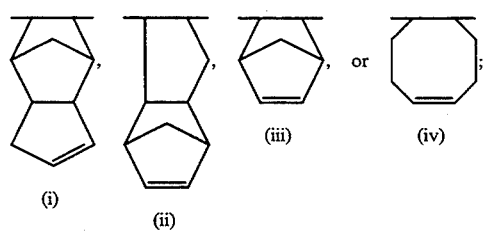

T is hydrogen, carboxy, carbalkoxy, carboxamide, hydroxy, alkoxy, epoxy, silane, or siloxy; the sum of m, n and p is at least 10, and m, n and p are 1–1000.

8. The crosslinkable or crosslinked polymer composition of claim 7 wherein m and n are 1–100, and p is 1–20.

9. The crosslinkable or crosslinked polymer composition of claim 8 wherein m and n are 1–50, and p is 1–10.

10. The crosslinkable or crosslinked polymer composition of claim 1 wherein the unsaturated elastomeric polymer is selected from the group consisting of polymers of butadiene, copolymers of butadiene, polymers of 3-methylbutadiene, copolymers of 3-methylbutadiene, polymers of 3-chlorobutadiene and copolymers of 3-chlorobutadiene.

11. The crosslinkable or crosslinked polymer composition of claim 1 wherein the unsaturated elastomeric polymer comprises poly-1,2-butadiene.

12. The crosslinkable or crosslinked polymer composition of claim 1 wherein the unsaturated elastomeric polymer comprises a member selected from the group consisting of styrene-butadiene copolymers and acrylonitrile-butadiene copolymers.

13. The crosslinkable or crosslinked polymer composition of claim 1 wherein the unsaturated elastomeric polymer comprises a terpolymer of ethylene, propylene and a cyclic diene selected from the group consisting of dicyclopentadiene, bicycloheptadiene, cyclooctadiene and vinylcyclohexene.

14. The crosslinkable or crosslinked polymer composition of claim 1 wherein the unsaturated elastomeric polymer comprises cyclized polyisoprene.

15. The crosslinkable or crosslinked polymer composition of claim 1 further comprising a hydrosilation catalyst.

16. The crosslinkable or crosslinked polymer composition of claim 1 wherein the silicon compound comprises at least one member selected from the group consisting of cyclic polysiloxanes, tetrasiloxysilanes and linear polysiloxanes.

17. The crosslinkable or crosslinked polymer composition of claim 1 wherein the silicon compound comprises a cyclic polysiloxane having the formula:

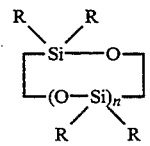

wherein R, which can be the same or different, is hydrogen or a saturated, substituted or unsubstituted alkyl or alkoxy radical, or a substituted or unsubstituted aromatic or aryloxy radical, n is an integer from 2 to about 20, and R is hydrogen on at least two of the silicon atoms.

18. The crosslinkable or crosslinked polymer composition of claim 1 wherein the silicon compound comprises a linear polysiloxane having the formula:

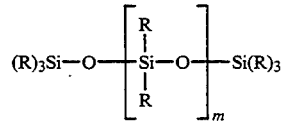

wherein R, which can be the same or different, is hydrogen or a substituted or unsubstituted saturated alkyl radical, or a substituted or unsubstituted phenyl radical, at least two R's are hydrogen, and m is an integer from about 0 to 1000.

19. The crosslinkable or crosslinked polymer composition of claim 1 wherein the silicon compound comprises a tetrasiloxysilane having the formula:

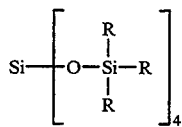

wherein R, which can be the same or different, is hydrogen or a saturated, substituted, or unsubstituted alkyl or alkoxy radical, or a substituted or unsubstituted aromatic or aryloxy radical and R is hydrogen on at least two of the silicon atoms.

20. The crosslinkable or crosslinked polymer composition of claim 1 wherein:
(a) the monomeric or oligomeric polyene comprises at least one member selected from the group consisting of polycyclic polyenes;
(b) the silicon compound comprises at least one member selected from the group consisting of:
(i) cyclic polysiloxanes having the formula:

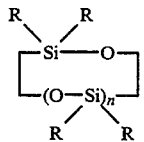

wherein R, which can be the same or different, is hydrogen or a saturated, substituted or unsubstituted alkyl or alkoxy radical, or a substituted or unsubstituted aromatic or aryloxy radical, n is an integer from 2 to about 20, and R is hydrogen on at least two of the silicon atoms;
(ii) tetrasiloxysilanes having the formula:

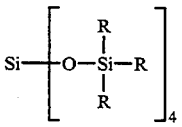

wherein R, which can be the same or different, is hydrogen or a saturated, substituted, or unsubstituted alkyl or alkoxy radical, or a substituted or unsubstituted aromatic or aryloxy radical, and R is hydrogen on at least two of the silicon atoms; and
(iii) linear polysiloxanes having the formula:

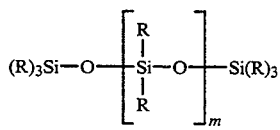

wherein R, which can be the same or different, is hydrogen or a substituted or unsubstituted saturated alkyl radical, or a substituted or unsubstituted phenyl radical, at least two R's are hydrogen, and m is an integer from about 0 to 1000; and
wherein the ratio of (i) hydrosilation reactive carbon-carbon double bonds in the polyene to (ii) ≡SiH groups in the silicon compound is from about 0.1:1 to about 1.5:1.

21. The crosslinkable or crosslinked polymer composition of claim 1 wherein the ratio of (i) hydrosilation reactive carbon-carbon double bonds in the monomeric or oligomeric polyene to (ii) ≡SiH groups in the silicon compound is from about 0.1:1 to about 1.5:1 and the ratio of hydrosilation reactive carbon-carbon double bonds in the unsaturated elastomeric polymer to ≡SiH groups in the silicon compound is from about 1000:1 to 0.5:1.

22. The crosslinkable or crosslinked polymer composition of claim 20 wherein the monomeric or oligomeric polyene comprises at least one member selected from the group consisting of dicyclopentadiene, tricyclopentadiene, norbornadiene, norbornadiene dimer, hexahydronaphthalene and dimethanohexahydronaphthalene.

23. A crosslinked polymer composition comprising the hydrosilation product of the crosslinkable polymer composition of claim 1.

24. A crosslinkable or crosslinked polymer composition comprising the reaction product of:
(a) an unsaturated elastomeric polymer having at least one hydrosilation reactive site of ethylenic unsaturation;
(b) a monomeric or oligomeric polyene having at least two hydrosilation reactive carbon-carbon double bonds; and
(c) a silicon compound having at least two hydrosilation reactive ≡SiH groups and comprising at least one member selected from the group consisting of cyclic polysiloxanes, tetrasiloxysilanes and linear polysiloxanes,
wherein at least one of the polyene, silicon compound and polymer has more than two hydrosilation reactive sites; and
wherein the unsaturated elastomeric polymer is present at a level of at least 40 wt. percent.

25. The crosslinkable or crosslinked polymer composition of claim 24 wherein the unsaturated elastomeric polymer is present at a level of from about 70 to about 99 wt. percent.

26. The crosslinkable or crosslinked polymer composition of claim 24 wherein the unsaturated elastomeric polymer comprises at least one member of the group consisting of:
(a) unsaturated polymers having the formula:

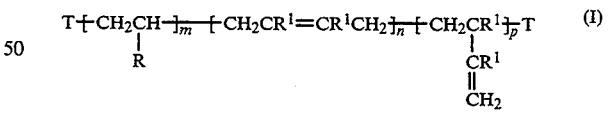

where R is phenyl, nitrile, carboxy, carbalkoxy, carboxamide, hydroxy, alkoxy, epoxy, silane or siloxy; $R^1$ is hydrogen, alkyl, or halogen; T is hydrogen, carboxy, carbalkoxy, carboxamide, hydroxy, alkoxy, epoxy, silane or siloxy; the sum of m, n and p is at least 10, and at least one of n and p is greater than 0;
(b) unsaturated polymers having the formula:

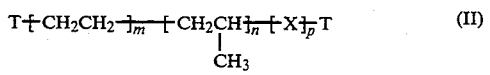

where X is —CH$_2$CH(R)— and R is vinyl or 3-cyclohexenyl, or X is:

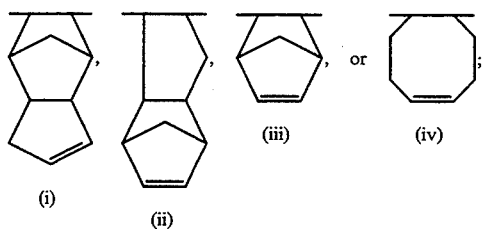

T is as described above; the sum of m, n and p is at least 10, and none of m, n and p is zero; and (c) cyclized polyisoprene.

27. The crosslinkable or crosslinked polymer composition of claim 24 wherein the unsaturated elastomeric polymer is selected from the group consisting of polymers of butadiene, copolymers of butadiene, polymers of 3-methylbutadiene, copolymers of 3-methylbutadiene, polymers of 3-chlorobutadiene and copolymers of 3-chlorobutadiene.

28. The crosslinkable or crosslinked polymer composition of claim 24 wherein the unsaturated elastomeric polymer comprises poly-1,2-butadiene.

29. The crosslinkable or crosslinked polymer composition of claim 24 wherein the unsaturated elastomeric polymer comprises a member selected from the group consisting of styrene-butadiene copolymers and acrylonitrile-butadiene copolymers.

30. The crosslinkable or crosslinked polymer composition of claim 24 wherein the unsaturated elastomeric polymer comprises a terpolymer of ethylene, propylene and a cyclic diene selected from the group consisting of dicyclopentadiene, bicycloheptadiene, cyclooctadiene and vinylcyclohexene.

31. The crosslinkable or crosslinked polymer composition of claim 24 wherein the unsaturated elastomeric polymer comprises cyclized polyisoprene.

32. The crosslinkable or crosslinked polymer composition of claim 24 further comprising a hydrosilation catalyst.

33. The crosslinkable or crosslinked polymer composition of claim 24 wherein:
(a) the monomeric or oligomeric polyene comprises at least one member selected from the group consisting of polycyclic polyenes;
(b) the silicon compound comprises at least one member selected from the group consisting of:
(i) cyclic polysiloxanes having the formula:

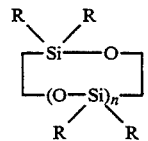

wherein R, which can be the same or different, is hydrogen or a saturated, substituted or unsubstituted alkyl or alkoxy radical, or a substituted or unsubstituted aromatic or aryloxy radical, n is an integer from 2 to about 20, and R is hydrogen on at least two of the silicon atoms;

(ii) tetrasiloxysilanes having the formula:

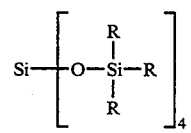

wherein R, which can be the same or different, is hydrogen or a saturated, substituted, or unsubstituted alkyl or alkoxy radical, or a substituted or unsubstituted aromatic or aryloxy radical, and R is hydrogen on at least two of the silicon atoms; and (iii) linear polysiloxanes having the formula:

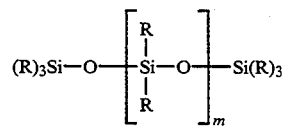

wherein R, which can be the same or different, is hydrogen or a substituted or unsubstituted saturated alkyl radical, or a substituted or unsubstituted phenyl radical, at least two R's are hydrogen, and m is an integer from about 0 to 1000; and wherein the ratio of (i) hydrosilation reactive carbon-carbon double bonds in the polyene to (ii) ≡SiH groups in the silicon compound is from about 0.1:1 to about 1.5:1.

34. The crosslinkable or crosslinked polymer composition of claim 24 wherein the ratio of (i) hydrosilation reactive carbon-carbon double bonds in the polyene to (ii) ≡SiH groups in the silicon compound is from about 0.1:1 to about 1.5:1 and the ratio of hydrosilation reactive carbon-carbon double bonds in the unsaturated elastomeric polymer to ≡SiH groups in the silicon compound is from about 1000:1 to about 0.5:1.

35. A crosslinked polymer composition comprising the hydrosilation product of the crosslinkable polymer composition of claim 24.

36. The crosslinked composition of claim 35 wherein the polyene comprises the reaction product of:
(a) an initial monomeric or oligomeric polyene having at least two hydrosilation reactive carbon-carbon double bonds; and
(b) a silicon compound having at least two hydrosilation reactive ≡SiH groups and comprising at least one member selected from the group consisting of cyclic polysiloxanes, tetrasiloxysilanes and linear polysiloxanes; wherein the ratio of (i) hydrosilation reactive carbon-carbon double bonds in the initial polyene to (ii) ≡SiH groups in the silicon compound is at least about 1.8:1.

37. A process for preparing a crosslinked composition from a plurality of reactants comprising:
(a) an unsaturated elastomeric polymer having at least two hydrosilation reactive sites of ethylenic unsaturation; and
(b) a crosslinkable organosilicon prepolymer comprising the hydrosilation reaction product of reactants comprising:
(i) a monomeric or oligomeric polyene having at least two hydrosilation reactive carbon-carbon double bonds; and
(ii) a silicon compound having at least two hydrosilation reactive ≡SiH groups; and wherein at least one of the polyene and the silicon compound has more than two hydrosilation reactive sites, and at least one of the polymer and the organosilicon prepolymer has more than two hydrosilation reactive sites; and wherein the unsaturated elastomeric polymer is present at a level of at least 40 wt. percent;

the process comprising effecting hydrosilation reaction of the reactants.

38. The process of claim 37 wherein the unsaturated elastomeric polymer is present at a level of from about 70 to about 99 wt. percent.

39. The process of claim 37 comprising effecting the hydrosilation reaction in the presence of a hydrosilation catalyst.

40. The process of claim 37 wherein the unsaturated elastomeric polymer comprises at least one member of the group consisting of:

(a) unsaturated polymers having the formula:

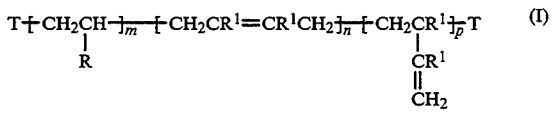

where R is phenyl, nitrile, carboxy, carbalkoxy, carboxamide, hydroxy, alkoxy, epoxy, silane or siloxy; $R^1$ is hydrogen, alkyl, or halogen; T is hydrogen, carboxy, carbalkoxy, carboxamide, hydroxy, alkoxy, epoxy, silane or siloxy; the sum of m, n and p is at least 10, and at least one of n and p is greater than 0;

(b) unsaturated polymers having the formula:

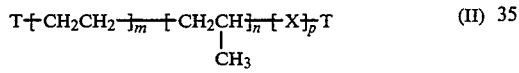

where X is —$CH_2CH(R)$— and R is vinyl or 3-cyclohexenyl, or X is

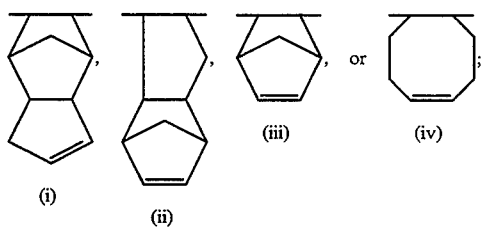

T is as described above; the sum of m, n and p is at least 10, and none of m, n and p is zero; and (c) cyclized polyisoprene.

41. The process of claim 37 wherein the silicon compound comprises at least one member selected from the group consisting of cyclic polysiloxanes, tetrasiloxysilanes and linear polysiloxanes.

42. A process for preparing a crosslinked composition from a plurality of reactants comprising:

(a) a monomeric or oligomeric polyene having at least two hydrosilation reactive carbon-carbon double bonds;

(b) a silicon compound having at least two hydrosilation reactive ≡SiH groups and comprising at least one member selected from the group consisting of cyclic polysiloxanes, tetrasiloxysilanes and linear polysiloxanes; and (c) an unsaturated elastomeric polymer having at least two hydrosilation reactive unsaturated carbon-carbon double bonds;

wherein at least one of the polyene, silicon compound and polymer has more than two hydrosilation reactive sites; and wherein the unsaturated elastomeric polymer is present at a level of at least 40 wt. percent;

the process comprising effecting hydrosilation reaction of the reactants.

43. The process of claim 42 comprising effecting the hydrosilation reaction in the presence of a hydrosilation catalyst.

44. The process of claim 42 further comprising prior to the step of effecting hydrosilation reaction of the reactants, the step of preparing the polyene from a plurality of reactants comprising:

(a) an initial monomeric or oligomeric polyene having at least two hydrosilation reactive carbon-carbon double bonds;

(b) a silicon compound having at least two hydrosilation reactive ≡SiH groups and comprising at least one member selected from the group consisting of cyclic polysiloxanes, tetrasiloxysilanes and linear polysiloxanes;

wherein the ratio of hydrosilation reactive carbon-carbon double bonds in the initial polyene to ≡SiH groups in the silicon compound is at least about 1.8:1;

the step of preparing the polyene comprising effecting hydrosilation reaction of the initial monomeric or oligomeric polyene and the silicon compound.

45. The process of claim 42 wherein the polyene comprises dicyclopentadiene, and the silicon compound comprises a plurality of methylhydrosiloxanes; and wherein the ratio of hydrosilation reactive carbon-carbon double bonds in the polyene to ≡SiH groups in the silicon compound is from about 0.1:1 to about 1.5:1.

46. A coated or encapsulated electronic component comprising an electronic component coated or encapsulated with the crosslinked composition of claim 23.

47. The coated or encapsulated electronic component of claim 46 wherein the crosslinked composition further comprises silica.

48. The coated or encapsulated electronic component of claim 46 wherein the electronic component is selected from the group consisting of semiconductor devices, capacitors, resistors, diodes, transistors, transformers, coils, wires, hybrid circuits and multichip modules.

49. A prepreg comprising the crosslinkable or crosslinked composition of claim 1 and a reinforcing agent.

50. The prepreg of claim 49 wherein the reinforcing agent comprises a member selected from the group consisting of glass, carbon and aramid fibers and mats.

51. A laminate comprising two or more prepregs as claimed in claim 49 clad with a conductive material.

52. A crosslinkable composition as claimed in claim 1.

53. A crosslinkable composition as claimed in claim 24 wherein about 30% to about 90% of the ≡SiH groups in the silicon compound are reacted with the carbon-carbon double bonds of the monomeric or oligomeric polyene.

54. The crosslinkable or crosslinked composition of claim 24 wherein the unsaturated elastomeric polymer has more than two reactive sites of ethylenic unsaturation.

55. The crosslinkable or crosslinked composition of claim 3 wherein the unsaturated elastomeric polymer is

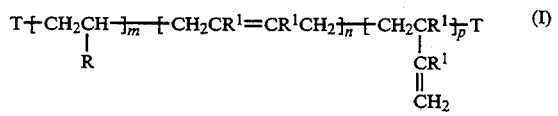

where R is phenyl, nitrile, carboxy, carbalkoxy, carboxamide, hydroxy, alkoxy, epoxy, silane or siloxy; $R^1$ is hydrogen, alkyl, or halogen; T is hydrogen, carboxy, carbalkoxy, carboxamide, hydroxy, alkoxy, epoxy, silane or siloxy; m, n and p are 0–1000; the sum of m, n and p is at least 10, and at least one of n and p is greater than 0; and wherein the monomeric or oligomeric polyene is selected from the group consisting of dicyclopentadiene, tricyclopentadiene, norbornadiene, norbornadiene dimer, hexahydronaphthalene and dimethanohexahydronaphthalene; and wherein the ratio of (i) hydrosilation reactive carbon-carbon double bonds in the monomeric or oligomeric polyene to (ii) ≡SiH groups in the silicon compound is from about 0.1:1 to about 1.5:1 and the ratio of hydrosilation reactive carbon-carbon double bonds in the unsaturated elastomeric polymer to ≡SiH groups in the silicon compound is from about 1000:1 to 0.5:1.

* * * * *

UNITED STATES PATENT AND TRADEMARK OFFICE
CERTIFICATE OF CORRECTION

PATENT NO. : 5,451,637

DATED : September 19, 1995

INVENTOR(S) : Raymond T. Leibfried

It is certified that error appears in the above-identified patent and that said Letters Patent is hereby corrected as shown below:

Column 20, line 61, after "greater than 0;" the following was left out

--(b) unsaturated polymers having the formula:--

Signed and Sealed this

Fifteenth Day of October, 1996

*Attest:*

BRUCE LEHMAN

*Attesting Officer*     *Commissioner of Patents and Trademarks*